(12) United States Patent  
Jung et al.

(10) Patent No.: US 8,541,273 B2
(45) Date of Patent: Sep. 24, 2013

(54) DIELECTRIC STACK

(75) Inventors: Sung Mun Jung, Singapore (SG); Swee Tuck Woo, Singapore (SG); Sanford Chu, Singapore (SG); Liang Choo Hsia, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 276 days.

(21) Appl. No.: 12/888,434

(22) Filed: Sep. 23, 2010

(65) Prior Publication Data  
US 2012/0074537 A1    Mar. 29, 2012

(51) Int. Cl.  
*H01L 21/8238* (2006.01)

(52) U.S. Cl.  
USPC ............... 438/201; 438/211; 257/E21.179; 257/E21.422

(58) Field of Classification Search  
USPC ............. 438/201, 211, 257, 263, 264, 593; 257/E21.179, E21.422, E21.68  
See application file for complete search history.

(56) References Cited

U.S. PATENT DOCUMENTS

| 6,376,885 | B1 * | 4/2002 | Tseng ........................... 257/382 |
| 2003/0219947 | A1 | 11/2003 | Shin et al. |
| 2004/0228969 | A1 | 11/2004 | Lung et al. |
| 2005/0110102 | A1 | 5/2005 | Wang et al. |
| 2009/0039406 | A1 | 2/2009 | Kitagawa et al. |
| 2009/0111265 | A1 * | 4/2009 | Min et al. ...................... 438/682 |
| 2010/0207192 | A1 | 8/2010 | Uenishi et al. |

* cited by examiner

*Primary Examiner* — Hoai V Pham  
(74) *Attorney, Agent, or Firm* — Horizon IP Pte. Ltd.

(57) ABSTRACT

A method of forming a device is disclosed. The method includes providing a substrate and forming a device layer on the substrate having a formed thickness $T_{FD}$. A capping layer is formed on the substrate having a formed thickness $T_{FC}$. Forming the capping layer consumes a desired amount of the device layer to cause the thickness of the device layer to be about the target thickness $T_{TD}$. The thickness of the capping layer is adjusted from $T_{FC}$ to about a target thickness $T_{TC}$.

20 Claims, 12 Drawing Sheets

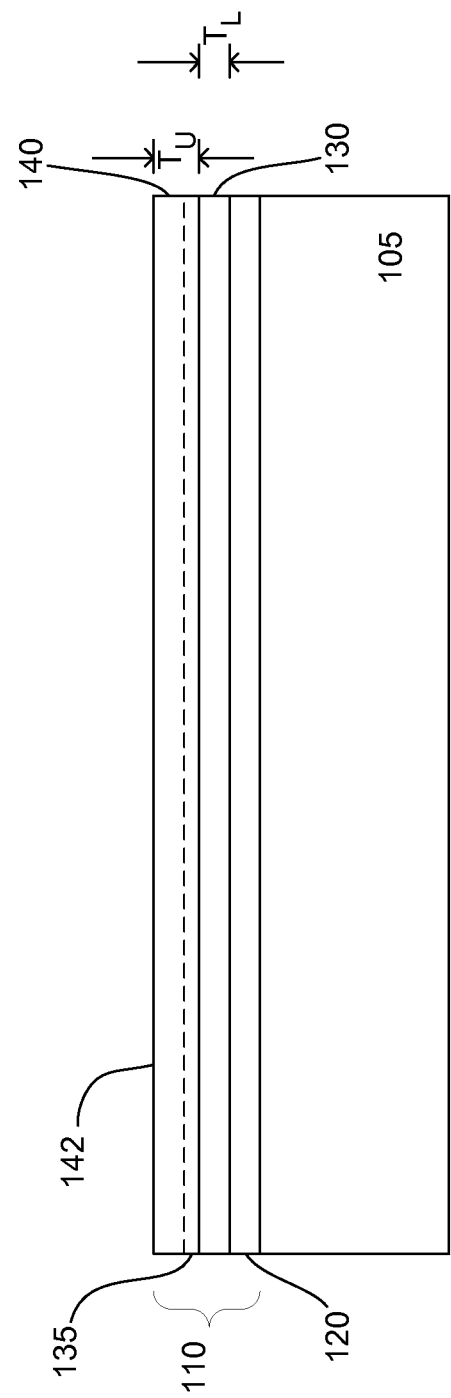

DIELECTRIC STACK

CROSS-REFERENCE

This application is concurrently filed with U.S. patent application No. 12/888,431 entitled "EEPROM Cell" filed Sep. 23, 2010, and U.S. patent application No. 12/888,437 entitled "EEPROM Cell" filed Sep. 23, 2010, which are herein incorporated by reference for all purposes.

BACKGROUND

Non-volatile memory (NVM) circuits have achieved widespread adoptions for code and data storage applications. An important aspect of NVM circuits is their performance, which includes endurance (number of programming or write/erase cycles) and data retention after write/erase cycling and erase speed. Within the industry, the performance of NVM technology has been characterized extensively. Generally, the NVM circuits should be able to endure over 100 thousand to 1 million programming cycles with data retention exceeding 20 years, even at extreme ambient temperatures.

One type of NVM circuits is a silicon-oxide-nitride-oxide-silicon (SONOS) NVM circuit. In SONOS types of NVM circuits, memory operations, such as programming and erasing involve charging and discharging electrons from a nitride layer of an oxide-nitride-oxide dielectric stack. The charging and discharging of electron charge is achieved by, for example, Fowler-Nordheim (FN) tunneling and/or hot electron injection (HCI).

The thickness of the various layers of the dielectric stack is important as they affect programming and erase speeds. For example, a thicker storage layer results in slow erase speed while a thinner storage layer results in slow programming speed. This can impact yield due to small operating window. The thickness of the other layers as well as the overall thickness of the storage stack also affect the performance and reliability of the memory cell. For example, thinner dielectric layer and bottom oxide increases erase speed, but may cause data retention problems. Tight control of the thickness of the different layers is therefore important for performance and reliability of NVM circuits.

SUMMARY

A method of forming a device is disclosed. The method includes providing a substrate and forming a device layer on the substrate having a formed thickness $T_{FD}$. A capping layer is formed on the substrate having a formed thickness $T_{FC}$. Forming the capping layer consumes a desired amount of the device layer to cause the thickness of the device layer to be about the target thickness $T_{TD}$. The thickness of the capping layer is adjusted from $T_{FC}$ to about a target thickness $T_{TC}$.

A device is also presented. The device comprises a substrate and a first device layer on the substrate comprising a target thickness $T_{TFD}$. The device also includes a second device layer on the substrate over the first device layer having a target thickness $T_{TSD}$. A lower portion of the second device layer comprises a consumed upper portion of the first device layer.

These and other objects, along with advantages and features of the present invention herein disclosed, will become apparent through reference to the following description and the accompanying drawings. Furthermore, it is to be understood that the features of the various embodiments described herein are not mutually exclusive and can exist in various combinations and permutations.

In another embodiment, a method of forming a device is also disclosed. The method includes forming a base dielectric layer on the substrate having a base target thickness $T_{TB}$. A storage dielectric layer is formed over the base dielectric layer. The storage dielectric layer has a storage formed thickness $T_{FS}$. An upper dielectric layer is formed over the storage dielectric layer having a upper formed thickness $T_{FU}$. Forming the upper dielectric layer consumes a desired amount of the storage dielectric layer to produce a storage dielectric layer with a storage target thickness $T_{TS}$. $T_{FU}$ of the upper dielectric layer is adjusted to about an upper target thickness $T_{TU}$.

These and other objects, along with advantages and features of the present invention herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIGS. 1a-b show cross-sectional views of various embodiments of a dielectric stack;

FIGS. 5a-g show cross-sectional views of a process of forming an embodiment of a memory cell.

DETAILED DESCRIPTION

Embodiments generally relate to forming a dielectric stack having tight thickness control. The dielectric stack may be used in semiconductor devices. For example, the dielectric stack may be employed in forming devices, such as non-volatile memory devices. Such memory devices, for example, can be incorporated into standalone memory devices, such as USB or other types of portable storage units, or ICs, such as microcontrollers or system on chips (SoCs). The devices or ICs can be incorporated into or used with, for example, consumer electronic products, such as computers, cell phones, and personal digital assistants (PDAs).

Figure 1A:
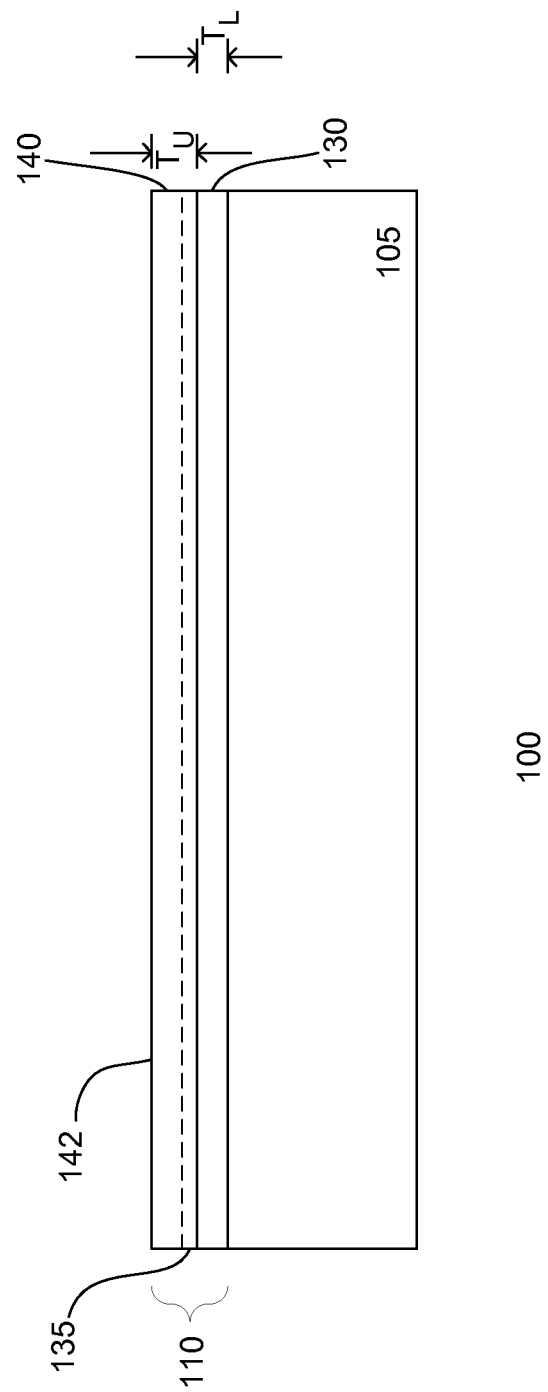

FIG. 1a shows an embodiment 100 of a dielectric stack 110. As shown, the dielectric stack is disposed on a substrate 105. Various types of substrates used in semiconductor devices may be used. For example, the substrate may comprise a silicon wafer, such as a lightly p-type doped substrate wafer. Other types of substrates, including silicon germanium or silicon-on-insulator (SOI) wafers, are also useful. The substrate may be a bare substrate. In other embodiments, the substrate may include features in or above the substrate, such as doped regions, isolation regions, gates or a combination thereof.

In one embodiment, the dielectric gate stack includes at least first and second dielectric layers 130 and 140 disposed on the substrate. The second dielectric layer is disposed over the first dielectric layer. In one embodiment, the first layer comprises a charge storage layer. The charge storage layer comprises, for example, silicon nitride. Other types of materials capable of storing charges may also be used to serve as the first dielectric layer. The second dielectric layer comprises a capping layer. The capping layer, for example, serves to suppress charge flow to the storage layer below from a device layer above, such as a gate. In one embodiment, the capping layer comprises silicon oxide. In one embodiment, the capping layer comprises in-situ steam generated (ISSG) silicon oxide. Other capping materials may also be useful.

In one embodiment, the different layers of the dielectric stack are formed with a desired thickness. The desired thickness of the different layers of the dielectric stack can be tightly controlled. In one embodiment, the desired thickness of the different layers of the dielectric stack can be tightly controlled from wafer to wafer or wafer lot to wafer lot.

In one embodiment, a lower portion 135 of the second or upper dielectric layer comprises a consumed upper portion of the first or lower dielectric layer. Providing the lower portion of the upper dielectric layer which comprises a consumed upper portion of the lower dielectric layer enables tight control of the thickness $T_L$ of the lower dielectric layer. For example, the amount of consumption can be selected to result in the desired $T_L$. A top surface 142 of the upper dielectric layer, in one embodiment, comprises an etched top surface. The etched top surface results from thinning of the upper dielectric layer to a desired thickness $T_U$. This facilitates tight control of the thickness $T_U$. For example, the variance of the thickness $T_U$ may be controlled within 1-2 Å between wafers or lots of wafers. In other embodiments, the top surface of the upper dielectric layer may be an unetched surface.

FIG. 1b shows another embodiment 100 of a dielectric stack 110. As shown, the dielectric stack is disposed on a substrate 105. Various types of substrates used in semiconductor devices may be used. For example, the substrate may comprise a silicon wafer, such as a lightly p-type doped substrate wafer. Other types of substrates, including silicon germanium or silicon-on-insulator (SOI) wafers, are also useful. The substrate may be a bare substrate. In other embodiments, the substrate may include features in or above the substrate, such as doped regions, isolation regions, gates or a combination thereof.

The dielectric stack is similar to the dielectric stack of FIG. 1a. Additionally, the dielectric stack includes a base dielectric layer 120 below the first and second dielectric layers 130 and 140. The base dielectric layer serves, for example, as a tunneling layer. In one embodiment, the base dielectric layer comprises silicon oxide. Other types of base dielectric layers may also be useful. For example, the base layer may comprise silicon nitrided oxide.

The base dielectric layer comprises a thickness $T_B$. In one embodiment, the thickness $T_B$ can be tightly controlled. In one embodiment, the base dielectric layer comprises thermal silicon oxide or silicon nitrided oxide. Other types of base dielectric layers whose thickness can be tightly controlled may also be useful. For example, the base dielectric layer may comprise ISSG silicon oxide or silicon nitrided oxide. As for the first and second dielectric layer 130 and 140, they are similar to those described in FIG. 1a. In alternative embodiments, the first and second dielectric layers may be repeated to form multiple NO stacks on a base dielectric layer. Other configurations of dielectric layers to form a dielectric stack may also be useful.

The dielectric stack may serve as, for example, a gate dielectric layer of a transistor. In other embodiments, the dielectric stack may serve as a gate dielectric or intergate dielectric of a NVM memory cell. Employing the dielectric stack for other purposes may also be useful.

Figure 2:
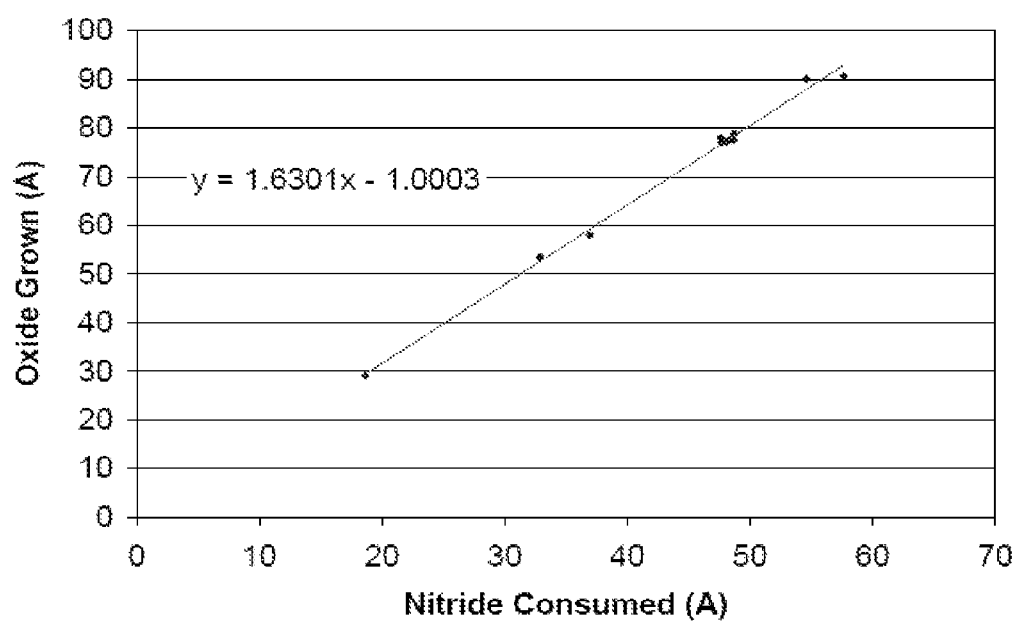
FIG. 2 shows a relation between oxide growth versus nitride consumption.

An experiment was conducted to determine consumption of the first dielectric layer based on growth of the second dielectric layer. In one embodiment, growth of ISSG silicon oxide versus consumption of silicon nitride is determined. FIG. 2 plots growth of ISSG silicon oxide versus consumption of underlying silicon nitride. As shown, the slope of oxide growth versus nitride consumption is:

$y=1.6301x-1.0003.$

Based on the relation between the growth of the second dielectric layer versus the consumption of the first dielectric layer, the thickness of the first dielectric layer can be precisely controlled by its consumption. For example, the thickness of the silicon nitride layer can be precisely controlled by consuming the desired amount based on growth of the ISSG silicon oxide. In other embodiments, growth rate and consumption rate may also be determined for other types of materials.

Figure 3:
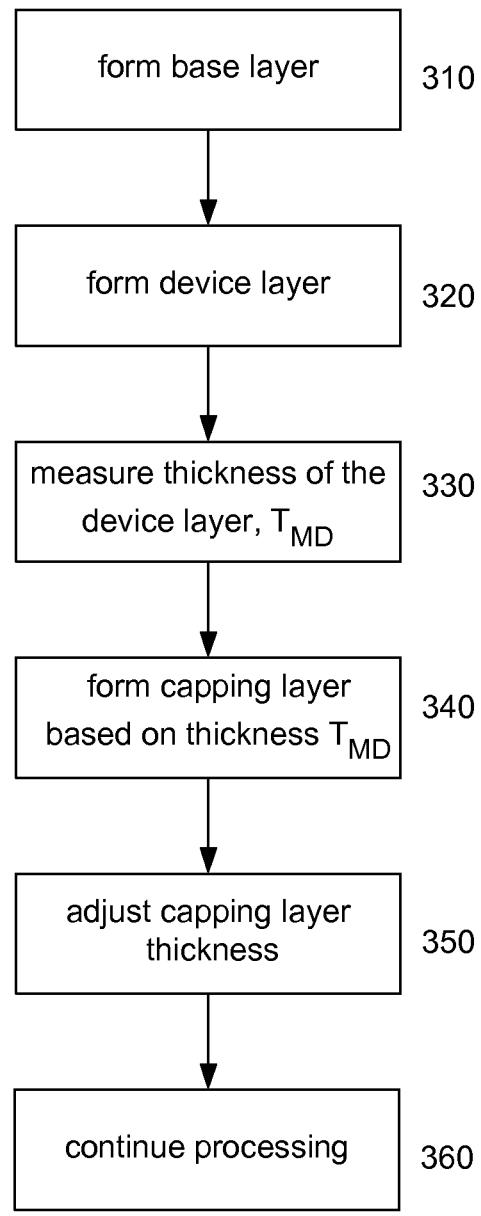
FIG. 3 shows an embodiment of a process flow for forming a dielectric stack.

FIG. 3 shows an embodiment of a process flow 300 for forming a dielectric stack. At step 310, a substrate prepared for processing is provided. Various types of substrates used in semiconductor devices may be used. For example, the substrate may comprise a silicon wafer, such as a lightly p-type doped substrate wafer. Other types of substrates, including silicon germanium or silicon-on-insulator (SOI) wafers, are also useful. The substrate may be prepared with, for example, device features in or above the substrate, such as doped regions, isolation regions, gates or a combination thereof. In one embodiment, the substrate is prepared up to the stage for forming a dielectric stack for a memory cell, such as a gate dielectric or intergate dielectric. Providing a prepared substrate at other stage of processing may also be useful.

In one embodiment, a base layer is formed on the prepared substrate. The base layer, in one embodiment, comprises a tunneling layer. In one embodiment, the base layer comprises silicon oxide. The silicon oxide may be formed on the substrate by thermal oxidation. In other embodiments, the base layer may be formed by ISSG. Other types of base layers, such as silicon nitrided oxide, may also be useful. In one embodiment, the base layer is formed with a thickness $T_B$ which can be tightly controlled. The target thickness $T_B$, for example, may be about 20-70 Å. This target thickness $T_B$ may have a variance of about +/−0.5 Å from wafer to wafer or lot to lot. This, for example, results in the thickness control of about 1.5%. Forming the base layer using other techniques may also be useful. Other techniques may preferably result in a tightly controlled thickness $T_B$.

At step 320, a device storage layer is formed on the substrate. In the case of having a base layer, the device layer is formed on the base layer. In other embodiments, the device layer is formed on the prepared substrate. The device layer, for example, serves as a storage layer which stores charges. Other types of device layers may also be used. The storage layer, in one embodiment, comprises silicon nitride. The silicon nitride may be formed by chemical vapor deposition (CVD). Forming other types of storage layers or using other techniques may also be useful. The thickness of the formed device layer is $T_{FD}$. In one embodiment, $T_{FD}$ is designed to be greater than a target thickness $T_{TD}$ of the device layer.

After the device layer is formed, its thickness is measured at step 330. The thickness of the device layer may be measured using various metrological techniques, for example, transmission electron microscopy (TEM) and ellipsometry.

The measured thickness of the device layer is equal to $T_{MD}$. Different sampling sizes may be used depending on the setup. For example, 2-3 wafers may be measured to obtain $T_{MD}$ in a batch of wafers.

At step 340, the process continues to form a capping layer on the device layer. The capping layer, for example, serves as a blocking layer of the dielectric stack to block charge flow from, for example, a gate above to the device or storage layer. The capping layer, in one embodiment, comprises silicon oxide. Other types of capping layers may also be useful. Forming the capping layer consumes a portion of the device layer. The amount of consumption of the device layer depends on the amount of growth of the capping layer. In one embodiment, the capping layer is formed by an ISSG process. For example, the silicon oxide capping layer is formed by an ISSG process. Other types of processes of forming the capping layer which consumes an underlying device layer while being formed may also be useful.

The capping layer is formed with a thickness $T_{FC}$. Forming the capping layer consumes a specified amount of the underlying device layer. In one embodiment, forming the capping layer with the thickness $T_{FC}$ produces a device layer having a thickness equal to $T_{TD}$. In one embodiment, the thickness $T_{FC}$ of the formed capping layer is at least equal to the target thickness $T_{TC}$ of the capping layer. In one embodiment, the thickness $T_{FC}$ of the formed capping layer is greater than $T_{TC}$. For example, forming the capping layer with the target thickness $T_{TC}$ should not result in over consuming the device layer.

A library may be created to contain recipes for forming the capping layer based on $T_{MD}$ of the device layer to produce the resulting device layer with the target thickness $T_{TD}$. Based on the recipe used to form the capping layer, a thickness $T_{FC}$ of the formed capping layer can be calculated or determined. Other techniques for determining the $T_{FC}$ may also be employed. For example, the formed capping layer may be measured by metrological techniques.

Once the $T_{FC}$ is calculated or determined, the thickness of the capping layer is adjusted to the target thickness $T_{TC}$. Adjusting the thickness of the capping layer may be achieved by etching to reduce $T_{FC}$ to about $T_{TC}$. The etch, for example, comprises a we etch with etchants such as dilute HF. The process may continue to form the device at step 360. For example, the process continues to form a memory cell. The process may further continue to form an IC. The IC may be a memory IC or an IC which includes memory cells.

In alternative embodiments, $T_{FC}$ which produces a device layer with $T_{TD}$ may be less than $T_{TC}$. In such cases, adjusting the thickness of the capping layer may comprise forming an additional capping layer over the previously formed capping layer to produce a capping layer having a thickness equal to $T_{TC}$. Forming the capping layer is achieved without consuming the underlying device layer. For example, the capping layer is formed by LPCVD. This maintains the thickness of the device layer at $T_{TD}$.

Figure 4:
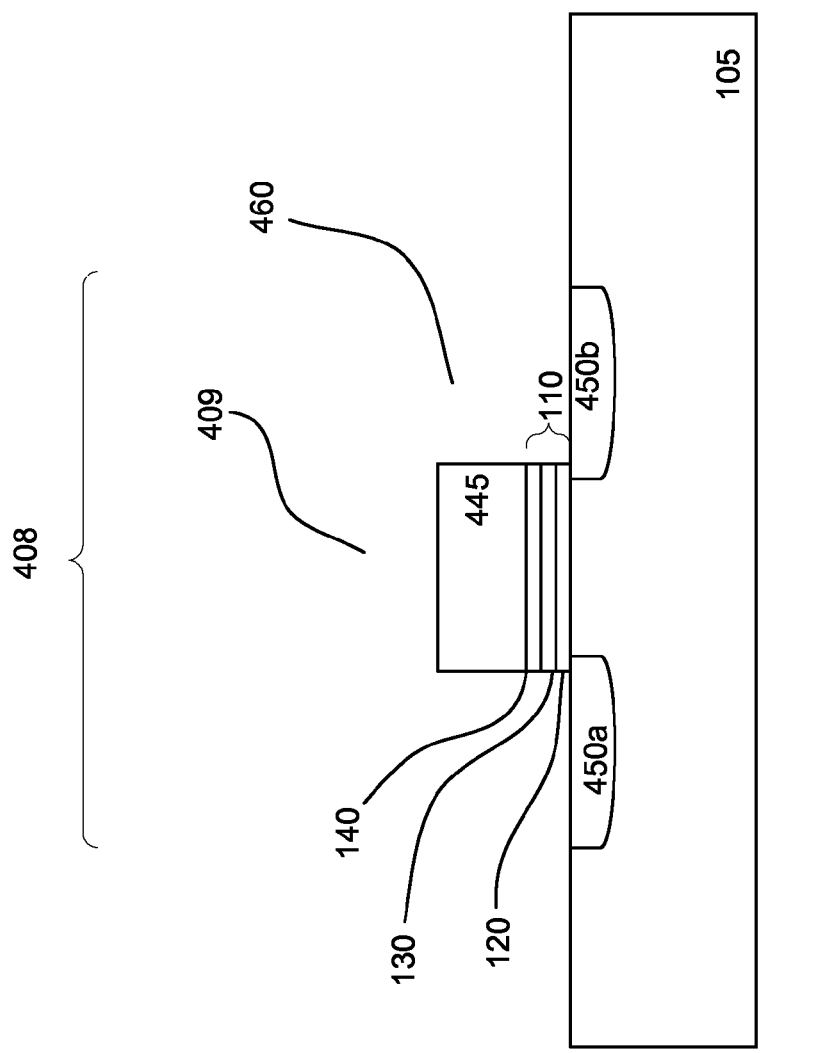
FIG. 4 shows an embodiment of a device.

FIG. 4 shows an embodiment of a device 400. The device includes a transistor 409. The transistor, for example, may be a non-volatile memory cell. Other types of transistors may also be useful. The transistor is disposed in a cell region 408 of a substrate 105. The substrate may comprise a silicon wafer, such as a lightly p-type doped substrate wafer. Other types of substrates, including silicon germanium or silicon-on-insulator (SOI) wafers, are also useful.

The cell region is isolated from other device regions by isolation regions (not shown). The isolation regions, for example, comprise shallow trench isolation (STI) regions. Other types of isolation regions may also be employed. The cell region may include a doped well (not shown). The doped well may comprise dopants of a second polarity type. The doped well serves as an active or cell region for first polarity type devices.

The transistor, in one embodiment, comprises a gate 460 disposed on the substrate. The gate comprises a gate electrode 445 over a gate dielectric 110. The gate electrode comprises, for example, polysilicon. Forming the gate electrode using other types of gate electrode materials, such as metals and polycides, may also be useful. The gate electrode may be doped, for example, by ion implantation. Depending on the application, the gate electrode may be doped by n-type or p-type dopants to form an $N^+$ or $P^+$ doped gate electrode.

In one embodiment, the gate dielectric comprises a dielectric stack having multiple dielectric layers. The gate dielectric stack, in one embodiment, includes at least a capping layer 140 over a charge storage layer 130, as described in FIG. 1. In other embodiments, the gate dielectric stack comprises a base layer 120 below the charge storage and capping layers, as described in FIG. 1*b*.

Dielectric spacers (not shown) may be optionally provided on sidewalls of the gate. The spacers may comprise silicon nitride. Other types of spacers may also be employed. For example, the spacers may include multiple spacers.

First and second doped regions 450*a-b* are provided adjacent to the gate. The first and second doped regions comprise dopants of a first polarity type, which is the opposite of the second polarity type. The first and second doped regions form source/drain (S/D) diffusion regions of the transistor. The doped regions, for example, serve as terminals of the transistor. The doped regions may include lightly doped and heavily doped portions. The lightly doped portions serve as extension regions which extend beneath the gate. The lightly doped regions may be lightly doped drains (LDD), including double diffused drains (DDD). The heavily doped portions are spaced apart from the gate. The heavily doped regions may be spaced apart based on the spacer width.

The surface of the doped regions and gate electrode may be provided with metal silicide contacts. An interlevel dielectric (ILD) layer (not shown) may be provided on the substrate covering the transistor. The interlevel dielectric layer may serve as a premetal dielectric (PMD) layer. Various materials, for example, BPSG, PSG, HDP oxide, TEOS or HARP, may be used to form the PMD layer. Other types of dielectric materials may also be used.

Contacts are formed in the PMD layer to provide connections to the different terminals of the transistor. The contacts, for example, comprise a conductive material such as tungsten. Other types of conductive materials may also be employed. A contact may include a contact liner. Various types of contact liners may be used. For example, the contact liner may be titanium (Ti), titanium nitride (TiN) or a combination thereof. In some embodiments, the liner comprises a composite liner comprising a combination of Ti and TiN, such as Ti/TiN or Ti/TiN/Ti. Other types of liners may also be employed.

In one embodiment, contacts are provided which are coupled to the dope regions and the gate. The first doped region may be coupled to a source line, the second doped region may be coupled to a bitline and the gate may be coupled to a wordline. Based on bias voltages applied to the different terminals, charges tunnel through the base layer to and from the charge storage layer for programming and erasing. A plurality of cells may be interconnected using wordlines, bitlines and source lines to form a memory array.

In other embodiments, the dielectric stack may be used with other types of memory cells, such as split gate memory cells, floating gate tunneling oxide (FLOTOX) type cells, erasable programmable read-only memory tunnel oxide (ETOX) type cells, as well as other types of devices.

Figure 5A:
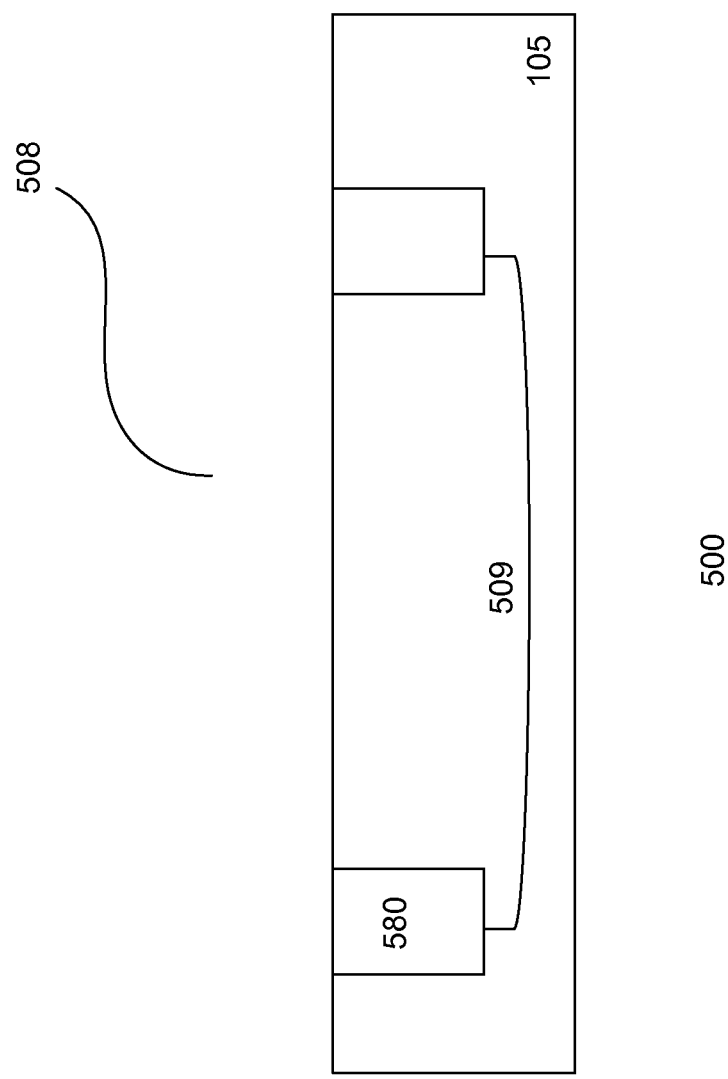

FIGS. 5a-g show cross-sectional views of an embodiment of a process 500 for forming a device or IC. Referring to FIG. 5a, a substrate 105 is provided. The substrate can comprise a silicon substrate, such as a lightly p-type doped substrate. Other types of substrates, including silicon germanium or silicon-on-insulator (SOI), are also useful.

As shown in FIG. 5a, a cell region 508 is prepared in the substrate. Although one cell region is shown, it is understood that the substrate may include other regions (not shown). For example, the substrate may include other cell regions of an array region in which memory cells are formed and logic regions in which logic devices are formed. The logic regions, for example, may include regions for devices, such as support devices for accessing the memory array. Additionally, the logic regions may include other types of devices, depending on the type of IC formed. The logic region, for example, may include regions for different voltage devices. For example, the logic region may include regions for high voltage devices, medium voltage devices and low voltage devices. Other configurations of logic regions may also be useful.

The cell region is separated from other regions by isolation regions 580. The isolation regions comprise, for example, STIs. Various processes can be employed to form the STI regions. For example, the substrate can be etched using etch and mask techniques to form trenches which are then filled with dielectric materials such as silicon oxide. Chemical mechanical polishing (CMP) can be performed to remove excess oxide and provide a planar substrate top surface. The STI regions can be formed, for example, prior to or after the formation of doped wells. Other processes or materials can also be used to form the STIs. In other embodiments, the isolation may be other types of isolation regions.

A doped well 509 is formed in the cell region. The doped well, in one embodiment, comprises dopants of the second polarity type. The doped well of the second polarity dopants is used to form first polarity type devices. In one embodiment, the doped well comprises a p-type doped well to form an n-type device. Alternatively, the doped well comprises an n-type doped well to form a p-type device. The doped well may be formed by implanting appropriate dopants with the desired dose and power into the substrate. The dopant type, dose and power may depend on the type of device to be formed.

The substrate may include other types of device regions for supporting other types of devices. For example, the substrate may include p-type and n-type devices, such as high, medium and low voltage p-type and n-type devices. Various types of n-type and p-type wells are provided for these devices. The various wells may be formed by separate implantation processes using implant masks. P-type dopants can include boron (B), aluminum (Al), indium (In) or a combination thereof, while n-type dopants can include phosphorus (P), arsenic (As), antimony (Sb) or a combination thereof.

Figure 5B:
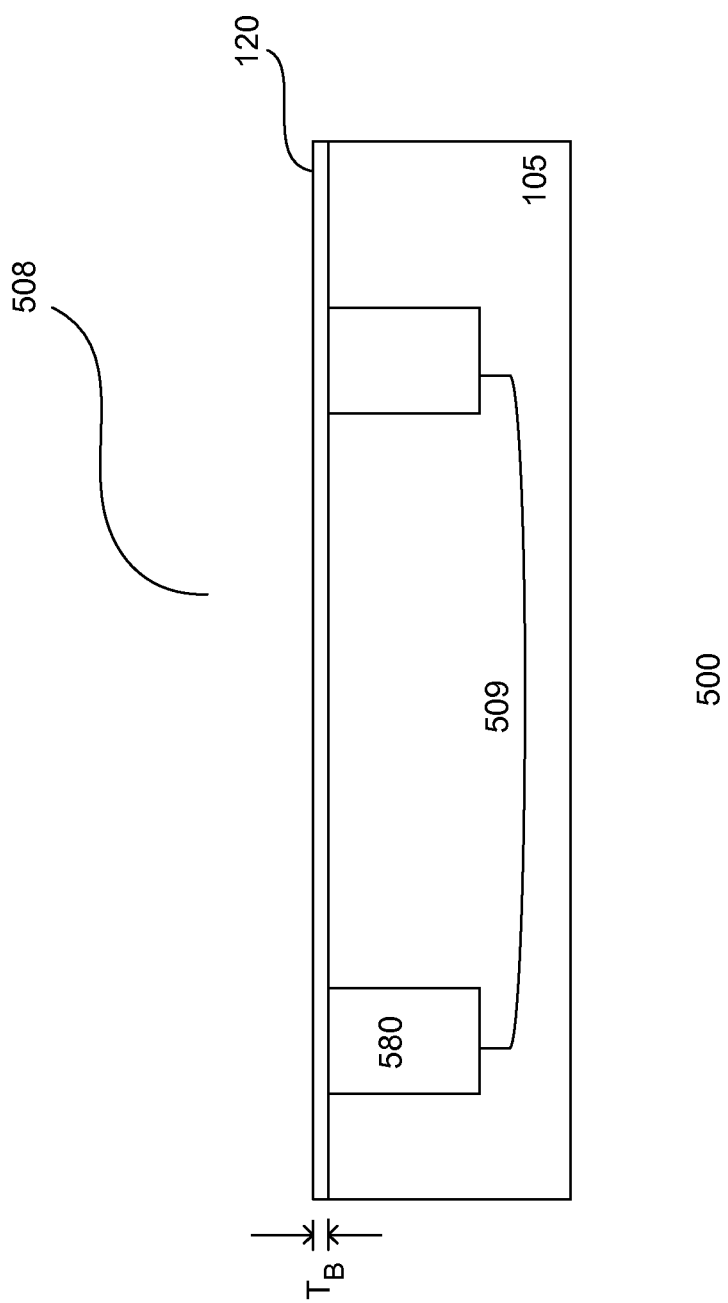

In FIG. 5b, a base layer 120 is formed on the substrate surface. In one embodiment, the base layer serves as a tunneling layer. The base layer, for example, comprises silicon oxide. Other types of base layer, such as silicon nitrided oxide, may also be useful. The base layer, in one embodiment, is formed by a thermal process, such as thermal oxidation. In other embodiments, the base layer may be formed by ISSG. In yet other embodiments, the base layer may be formed by other types of processes. For example, the base layer may be formed by CVD, such as LPCVD.

The base layer comprises a thickness $T_B$. In one embodiment, $T_B$ is equal to about a target thickness $T_{TB}$. Preferably, $T_B$ can be tightly controlled to equal about $T_{TB}$. For example, the base layer may be formed with a $T_{TB}$ of about 35 Å. The $T_B$ may be controlled to within a variance of about +/−0.5 Å from wafer to wafer or batch to batch. This results in about +/−1.5% variance of the thickness of the base layer from $T_{TB}$. Other base layer thicknesses or variances may also be useful.

Figure 5C:
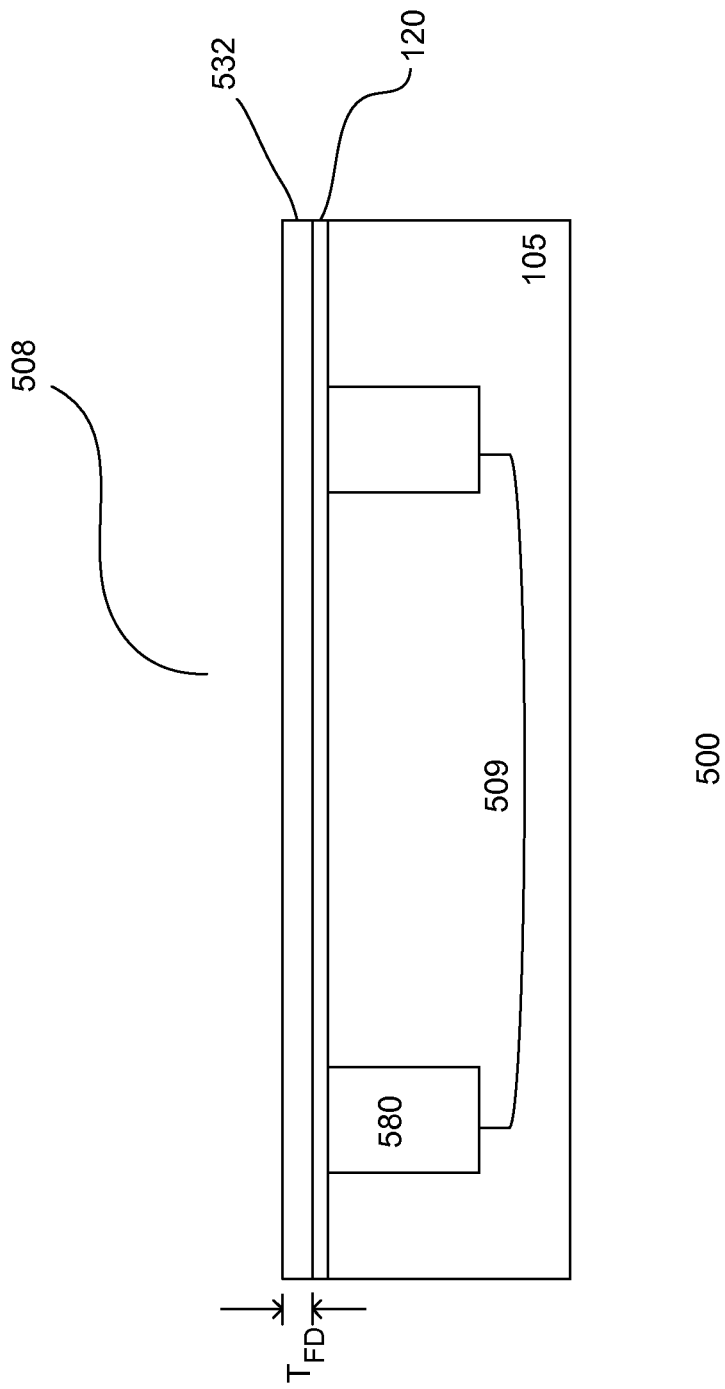

Referring to FIG. 5c, a device layer 532 is formed on the substrate. The device layer, for example, serves as a storage layer which stores charges. Other types of device layers may also be used. The device layer, in one embodiment, comprises silicon nitride. The silicon nitride may be formed by chemical vapor deposition (CVD). Forming other types of device or storage layers or using other techniques may also be useful. For example, the device layer may comprise silicon nitride or nitrides formed by decoupled plasma nitridation (DPN). The thickness of the formed device layer is $T_{FD}$. The $T_{FD}$, for example, is designed to be at least equal to a target thickness $T_{TD}$ of the device layer. In one embodiment, $T_{FD}$ is greater than a target thickness $T_{TD}$ of the device layer.

After the device layer is formed, its thickness is measured. The thickness of the device layer may be measured using various metrological techniques, for example, TEM or ellipsometry. The measured thickness of the device layer is equal to $T_{MD}$.

Figure 5D:
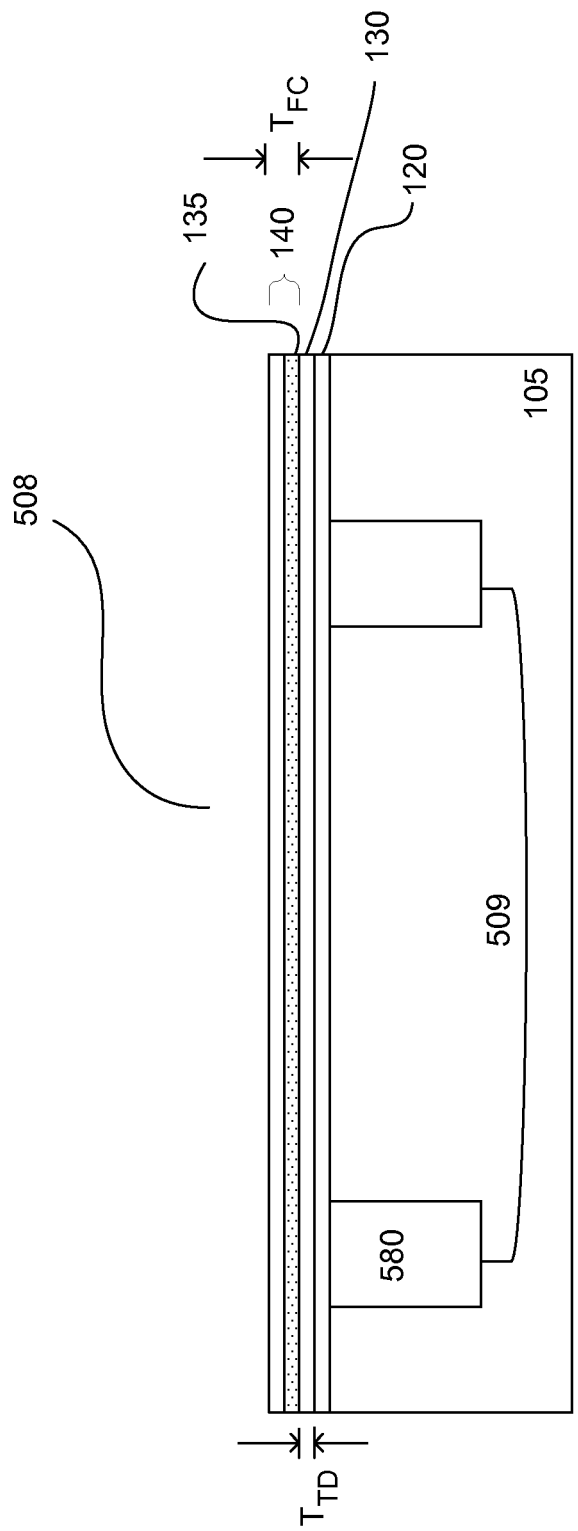

In FIG. 5d, a capping layer 140 is formed on the device layer. The capping layer, for example, serves as a blocking layer of the dielectric stack to block charge flow from the gate electrode to the device layer. In one embodiment, the capping layer comprises silicon oxide. Other types of capping layers, for example, $Al_2O_3$, may also be useful. In one embodiment, the target thickness $T_{TC}$ of the capping layer is about 50 Å. Other values of $T_{TC}$ may also be useful.

In one embodiment, forming the capping layer consumes a portion of the device layer. The amount of consumption of the device layer depends on the amount of growth of the capping layer. In one embodiment, the capping layer is formed by an ISSG process. For example, the silicon oxide capping layer is formed by an ISSG process. Other types of processes for forming the capping layer which consumes an underlying device layer while being formed may also be useful.

To form the capping layer, a capping layer recipe is selected. The capping layer recipe may be selected from a library of recipes. The recipes may be stored, for example, in a computer or tool used to form the capping layer. In one embodiment, a capping layer recipe determines the overall thickness $T_{FC}$ of the formed capping layer and an amount of the underlying charge storage layer consumed.

The recipe selected, in one embodiment, depends on measured thickness $T_{MD}$ of the device layer. For example, based on $T_{MD}$, a capping layer recipe is selected so that the forming of the capping layer consumes a desired amount of the underlying device layer to produce a device layer having a thickness equal to about the target thickness $T_{TD}$ of the device layer. The formed thickness $T_{FD}$ of the device layer, in one embodiment, should be sufficiently thick to produce a device layer 130 with $T_{TD}$ and a capping layer of at least the target thickness $T_{TC}$. For example, forming the capping layer with the target thickness $T_{TC}$ should not result in over consuming the device layer. In one embodiment, the thickness $T_{FC}$ of the formed capping layer produces a device layer with about $T_{TD}$ and a capping layer of greater than the target thickness $T_{TC}$ of the capping layer The overall thickness of the capping layer can be determined from the recipe selected. In other embodiments, the overall thickness of the capping layer $T_{FC}$ may be measured using, for example, various metrological techniques.

Figure 5E:
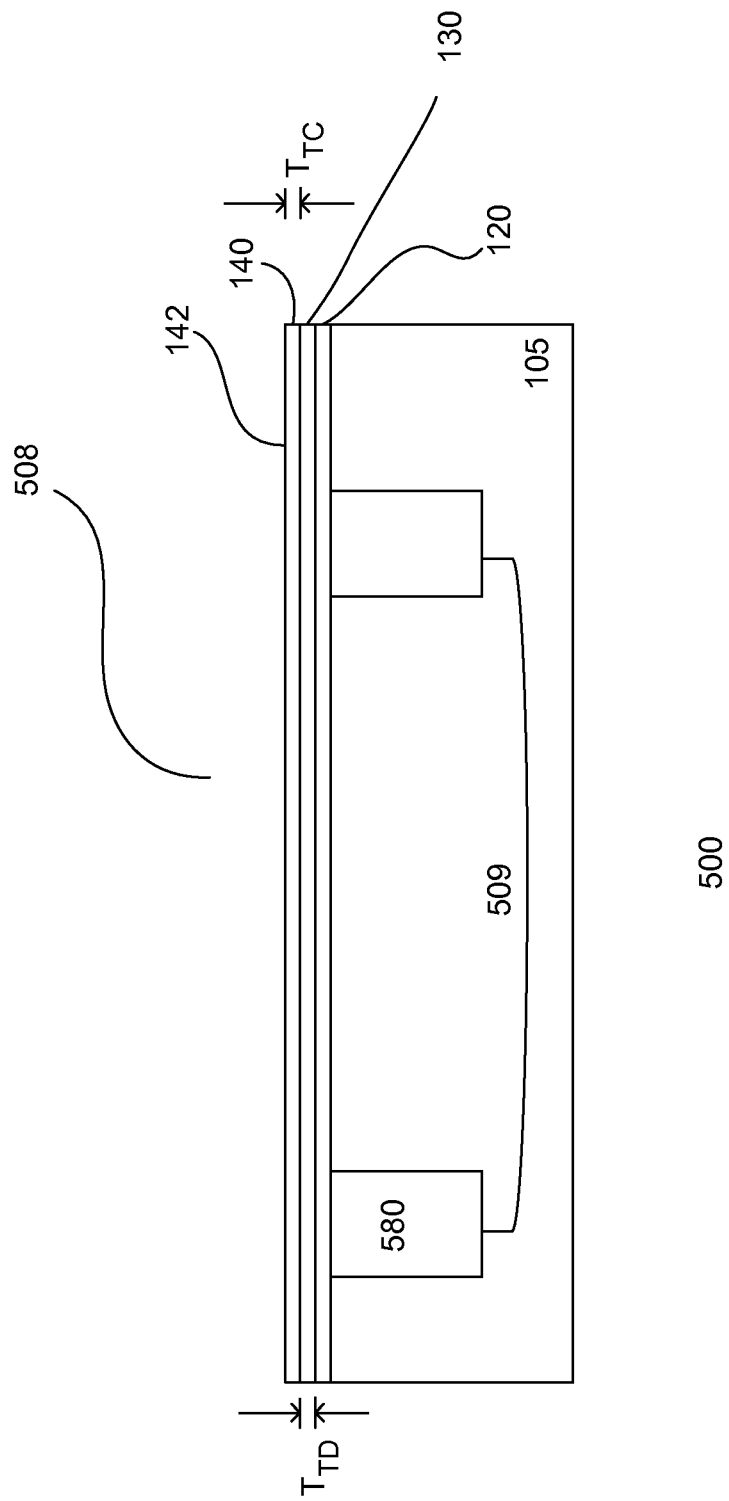

In one embodiment, the thickness of the capping layer is adjusted from $T_{FC}$ to $T_{TC}$, as shown in FIG. 5e. The thickness of the capping layer, for example, may be adjusted by, for example, a wet etch or wet clean. In one embodiment, the wet clean uses dilute HF as an etchant. Wet cleans using other etchants may also be useful. The etch rate of the wet clean can be determined by, for example, wet dip time. Based on the etch rate, the duration of the wet clean can be determined to produce a capping layer with a thickness equal to about $T_{TC}$. Other types of processes may also be employed to adjust the thickness of the capping layer.

In alternative embodiments, recipe selected consumes a desired amount of the underlying device layer to produce a device layer having a thickness equal to about the target thickness $T_{TD}$ of the device layer while resulting in a formed thickness $T_{FC}$ of the capping layer being less than the target thickness $T_{TC}$. In such cases, adjusting the thickness of the capping layer may involve forming a secondary capping layer on the capping layer (primary capping layer) to result in an overall capping layer having the target thickness $T_{TC}$. The forming of the secondary capping layer, in one embodiment, does not consume the underlying device layer.

Figure 5F:
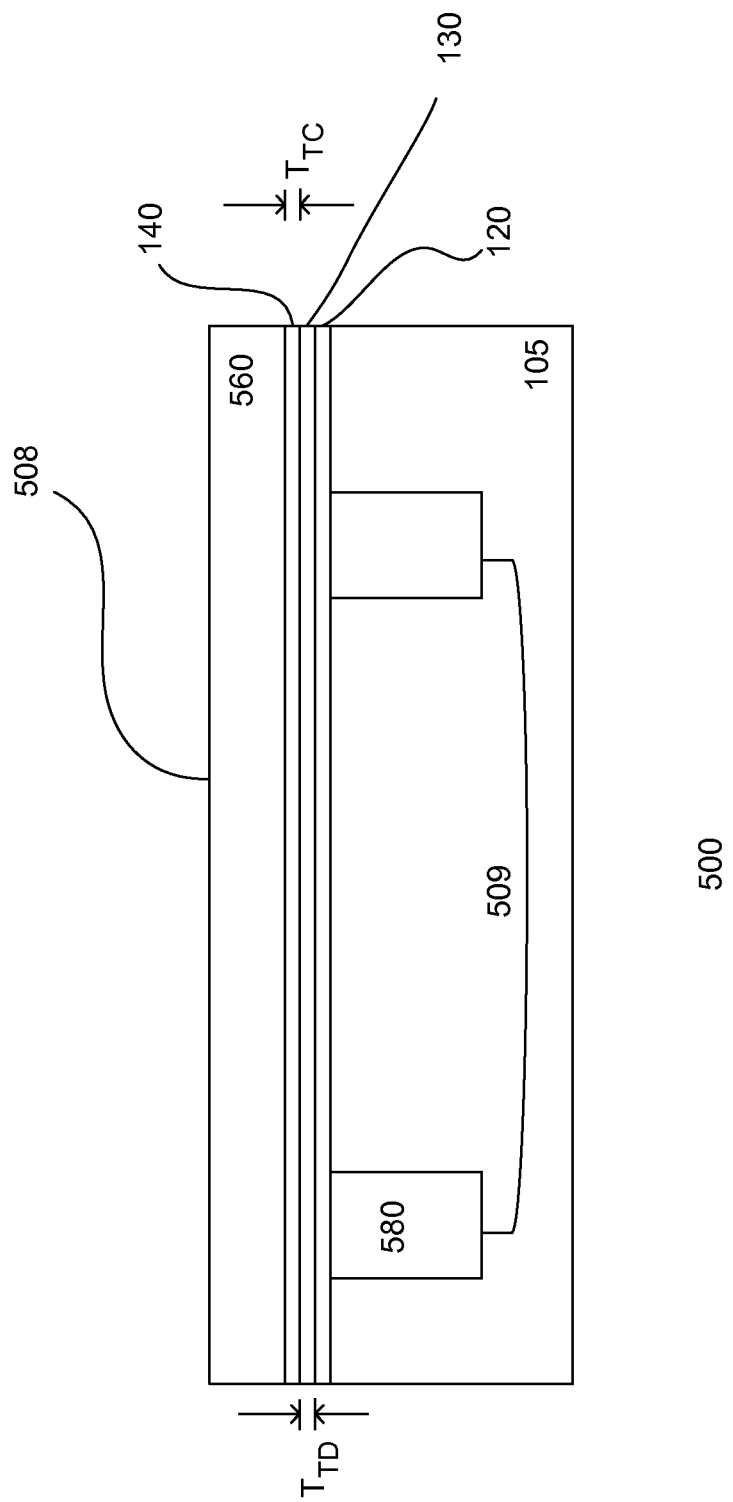

Referring to FIG. 5f, a gate electrode layer 560 is formed on the substrate over the dielectric stack. The gate electrode layer comprises, in one embodiment, polysilicon. The gate electrode layer can be formed as an amorphous or non-amorphous layer. The gate electrode may be doped. Various techniques may be employed to dope the gate electrode using, for example, ion implantation. Doping the gate electrode layer by in-situ doping may also be useful. Providing an undoped gate electrode layer may also be useful. Other types of gate electrode materials may also be useful. The thickness of the gate electrode layer may be about 800-2000 Å. Other thicknesses may also be useful. To form the gate electrode layer, techniques such as chemical vapor deposition (CVD), can be used. Other techniques may also be useful to form the gate electrode layer.

Figure 5G:
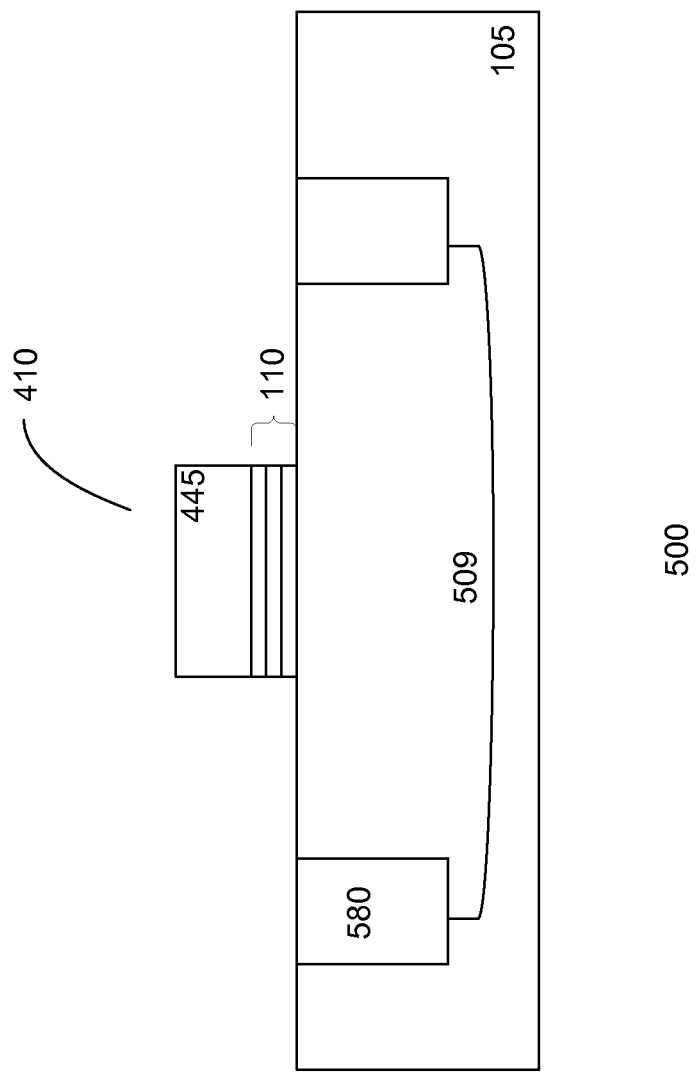

In FIG. 5g, the substrate is patterned to form a gate stack 410. For example, the gate electrode layer and dielectric stack are patterned to form the gate stack comprising the gate electrode 445 and gate dielectric stack 110. Techniques, such as mask and etch, can be used. For example, a photoresist layer is formed over the gate electrode layer and patterned, exposing portions thereof. An anisotropic etch, such as a RIE, is performed to remove exposed portions of the gate electrode layer and gate dielectric stack. To improve lithographic resolution, an anti-reflective coating (ARC) can be provided beneath the photoresist. In other embodiments, a hard mask may be employed to pattern the gate electrode layer.

The process continues to form the device. For example, the additional processing may include removing the mask layer and forming first portions of the dope regions adjacent to the gate. The first portions, for example, serve as S/D extension regions, which can be formed by, for example, implanting ions of the first polarity type. The implant may be self-aligned, using the gate and isolation regions as an implant mask. Sidewall spacers may be formed on sidewalls of the gate after forming the S/D extension regions. The gate sidewall spacers, for example, comprise nitride. Other types of spacer materials may also be useful. To form sidewall spacers, a spacer dielectric layer is deposited on the substrate. The spacers can be formed by using various techniques, such as plasma enhanced chemical vapor deposition (PECVD). Other techniques to form the spacer dielectric layer may also be useful. The spacer dielectric layer is subsequently aniso-tropically etched, such as by RIE, to remove horizontal portions, leaving non-horizontal portions on the sidewalls as the spacers.

The process may further continues to form the second portions of doped regions of the transistors, salicide contacts, PMD layer, contacts to the terminals of the cell and one or more interconnect levels to couple the terminals, for example, control gate lines, wordlines, bitlines, source lines, and well potential as well as interconnections for other devices. Additional processes may also include final passivation, dicing, assembly and packaging to complete the IC. Other processes are also useful. For example, other components, such as low voltage, medium voltage, and high voltage I/O devices can be formed prior to forming the interconnections. The memory cells can be formed as a memory device or embedded into a part of ICs.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

The invention claimed is:

1. A method of forming a device comprising:
   providing a substrate;
   forming a device layer on the substrate having a formed thickness $T_{FD}$;
   forming a capping layer on the substrate having a formed thickness $T_{FC}$, wherein forming the capping layer consumes a desired amount of the device layer to cause the thickness of the device layer to be about the target thickness $T_{TD}$ and wherein the amount of consumption of the device layer depends on the amount of growth of the capping layer; and
   adjusting the thickness of the capping layer from $T_{FC}$ to about a target thickness $T_{TC}$.

2. The method of claim 1 further comprises thermally forming a dielectric layer prior to forming the device layer.

3. The method of claim 1 further comprises measuring the $T_{FD}$ to obtain a measured thickness of the device layer $T_{MD}$.

4. The method of claim 3 wherein the $T_{FC}$ is determined or calculated from the $T_{MD}$.

5. The method of claim 1 wherein adjusting the $T_{FC}$ to about the $T_{TC}$ comprises etching.

6. The method of claim 1 wherein the device layer comprises a charge storage layer.

7. The method of claim 1 wherein the device layer comprises a nitride material and the capping layer comprises a thermally grown oxide material.

8. The method of claim 1 wherein the capping layer is formed by thermal oxidation.

9. The method of claim 1 wherein forming the capping layer comprises selecting a recipe which determines the TFC and an amount of consumption of the device layer.

10. The method of claim 1 wherein adjusting the $T_{FC}$ to about the $T_{TC}$ comprises wet etch or wet clean.

11. A method of forming a device comprising:
    forming a base dielectric layer on a substrate having a base target thickness $T_{TB}$;
    forming a storage dielectric layer over the base dielectric layer, the storage dielectric layer having a storage formed thickness $T_{FS}$;
    forming an upper dielectric layer over the storage dielectric layer having a upper formed thickness $T_{FU}$, wherein forming the upper dielectric layer consumes a desired amount of the storage dielectric layer to produce a storage dielectric layer with a storage target thickness $T_{TS}$; and adjusting $T_{FU}$ of the upper dielectric layer to about an upper target thickness $T_{TU}$.

12. The method of claim 11 wherein adjusting $T_{FU}$ comprises etching the upper dielectric layer.

13. The method of claim 12 wherein the base, storage and upper dielectric layers form a dielectric stack of a non-volatile memory.

14. A method of forming a device comprising:
providing a substrate;
forming a dielectric device layer on the substrate having a formed thickness $T_{FD}$; and
forming a dielectric capping layer on the substrate having a formed thickness $T_{FC}$, wherein forming the capping layer consumes a desired amount of the device layer to cause the thickness of the device layer to be about the target thickness $T_{TD}$.

15. The method of claim 14 further comprises adjusting the thickness of the capping layer from $T_{FC}$ to about a target thickness $T_{TC}$.

16. The method of claim 15 further comprises forming a base layer in between the substrate and the device layer.

17. The method of claim 14 further comprises measuring the $T_{FD}$ to obtain a measured thickness of the device layer $T_{MD}$.

18. The method of claim 17 wherein forming the capping layer comprises selecting a recipe which determines the $T_{FC}$ and an amount of consumption of the device layer.

19. The method of claim 18 wherein the selected recipe depends on the measured $T_{MD}$.

20. The method of claim 14 wherein the amount of consumption of the device layer depends on the amount of growth of the capping layer.

* * * * *